US007554392B2

(12) United States Patent
Hwa et al.

(10) Patent No.: US 7,554,392 B2
(45) Date of Patent: Jun. 30, 2009

(54) MULTIPLE OUTPUT POWER MODE AMPLIFIER

(75) Inventors: Jung Sang Hwa, Gojan-dong (KR); Jeon Moon-Suk, Kwanakgu (KR); Kyung-Tal Kang, Seongdong-go (KR); Kim Jung Hyun, Ojeon-dong (KR)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 69 days.

(21) Appl. No.: 11/739,355

(22) Filed: Apr. 24, 2007

(65) Prior Publication Data

US 2008/0265988 A1 Oct. 30, 2008

(51) Int. Cl.
*H03F 1/14* (2006.01)
*H03F 3/191* (2006.01)

(52) U.S. Cl. ........................................ 330/51; 330/302

(58) Field of Classification Search .................. 330/51, 330/151, 302
See application file for complete search history.

(56) References Cited

U.S. PATENT DOCUMENTS 3,434,070 A 3/1969 Bartnik et al.
5,152,004 A 9/1992 Vaisanen et al.
5,175,871 A 12/1992 Kunkel
5,276,912 A 1/1994 Siwiak et al.
5,530,923 A 6/1996 Heinonen et al.
5,661,434 A 8/1997 Brozovich et al.
5,758,269 A 5/1998 Wu
5,909,643 A 6/1999 Aihara
6,060,949 A 5/2000 Kaufman et al.
6,066,983 A 5/2000 Okoro
6,069,526 A 5/2000 Ballantyne
6,205,318 B1 3/2001 Schindler et al.
6,356,150 B1 3/2002 Spears et al.
6,363,685 B1 4/2002 Kugler
6,374,116 B1 4/2002 Peterzell et al.
6,487,419 B1 11/2002 Freed
6,603,359 B2 * 8/2003 Fujiwara et al. ............. 330/310
6,630,861 B2 10/2003 Kawaoka
6,700,439 B2 3/2004 Jackson
6,710,662 B2 * 3/2004 Wang ......................... 330/295
6,943,631 B2 9/2005 Scherrer et al.
7,161,422 B2 1/2007 Kim
7,315,205 B2 1/2008 Kim
7,345,534 B2 * 3/2008 Grebennikov ................ 330/51
7,348,841 B2 3/2008 Kim
7,388,427 B2 6/2008 Kim
7,394,313 B2 7/2008 Kim
7,420,412 B2 9/2008 Kim
2004/0108901 A1 6/2004 Apel et al.

FOREIGN PATENT DOCUMENTS

| | | |
|---|---|---|
| EP | 0977354 | 2/2000 |
| EP | 1032120 | 8/2000 |
| EP | 1229642 | 8/2002 |
| EP | 1330021 | 7/2003 |
| JP | 09/036675 | 7/1997 |
| KR | 2001/0105151 | 11/2001 |

* cited by examiner

*Primary Examiner*—Steven J Mottola

(57) ABSTRACT

A multi-mode power amplifier and an electronic device including the amplifier are described.

10 Claims, 13 Drawing Sheets

100
Control Signal1 (Vctrl1)
Control Signal2 (Vctrl2)
Voltage Control Circuitry
116
101
Input Matching Network
102
Driver 1
103
Impedance Matching Network 1
104
Driver 2
105
Impedance Matching Network 2
106
107
Impedance Matching Network 3
108
109
Main
110
Impedance Matching Network 4
111
112
Impedance Matching Network 5
114
115
Impedance Transformation Network
113

Load Line of Gain Block 903
901
902
100
900

MULTIPLE OUTPUT POWER MODE AMPLIFIER

BACKGROUND

Wireless devices are ubiquitous in many parts of the world. For example, portable wireless devices such as mobile phones, personal digital assistants (PDAs) and portable computers (e.g., laptop computers) are a convenience, if not a necessity.

In addition to being more prevalent, wireless devices are becoming smaller and lighter. Often, this translates into a reduction in the physical size and thus power of the battery powering the device. At the same time the battery is becoming smaller, the demand for 'use-time' (e.g., talk time of a mobile phone, or increased computing time for a laptop computer or PDA) is increasing. As can be appreciated, the demand for increased use-time can readily be met by increasing the power of the battery. Increasing the power of the battery often requires increasing the physical size of the battery.

Accordingly, the goal of reducing the size of the battery competes with the goal of increasing the available power of the battery. This has lead to investigating options to increase the battery life in smaller batteries in wireless devices.

In many portable wireless devices, the radio frequency (RF) power amplifier consumes a substantial portion of the power of the overall system of the device. As a result, poor efficiency in the RF power amplifier degrades the efficiency of the overall system; drains the battery more rapidly; and reduces the use-time. What is needed therefore is an RF power amplifier with improved efficiency and reduced power drain.

SUMMARY

In accordance with an illustrative embodiment, an amplifier includes a high-power signal path, a mid-power signal path and a low-power signal path. The amplifier also includes a voltage controller configured to selectively engage the high-power signal path, the mid-power signal path and the low-power signal path.

In accordance with another illustrative embodiment, an electronic device includes and an amplifier, which comprises: a high-power signal path, a mid-power signal path and a low-power signal path. The amplifier also includes a voltage controller configured to selectively engage the high-power signal path, the mid-power signal path and the low-power signal path.

In accordance with yet another representative embodiment, a multimode amplifier includes a high-power signal path; a mid-power signal path; and a low-power signal path. The amplifier does not include radio frequency switches and does not include direct current-to-direct current (DC-DC) converters between an input and the signal paths.

BRIEF DESCRIPTION OF THE DRAWINGS

Representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

The terms 'a' or 'an', as used herein are defined as one or more than one.

The term 'plurality' as used herein is defined as two or more than two.

The term 'PA' is an abbreviation for power amplifier and specifically is not an abbreviation for prior art.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of hardware, software, firmware, materials and methods may be omitted so as to avoid obscuring the description of the illustrative embodiments. Nonetheless, such hardware, software, firmware, materials and methods that are within the purview of one of ordinary skill in the art may be used in accordance with the illustrative embodiments. Such hardware, software, firmware, materials and methods are clearly within the scope of the present teachings. Furthermore, although described respect to a multiple mode amplifier, the present teachings may be applied to other types of circuit besides amplifiers.

In certain representative embodiments, switches are not used to control the power mode (i.e., low-power, medium (mid)-power, high-power) of amplifier circuits. For instance, switches such as relays, micromachined switches, transistor switches, PIN diode switches, and Schottky diode switches are not included. Furthermore, DC-DC converter circuits are not used in the amplifier circuits of the representative embodiments. As can be appreciated, these switches and DC-DC converter circuits are comparatively large and costly. Moreover, the power amplifiers of the representative embodiments provide comparable efficiency to that realized by known amplifiers with DC-DC converters. As such, the power amplifiers of the representative embodiments described herein provide comparatively improved efficiency and comparatively long use time in electronic devices by controlling the bias current to drivers during middle and low power mode, respectively. However, by foregoing the use of DC-DC converters, switches and external control circuits therefor, the cost, complexity and dedicated area for the amplifier can be comparatively reduced.

Figure 1:
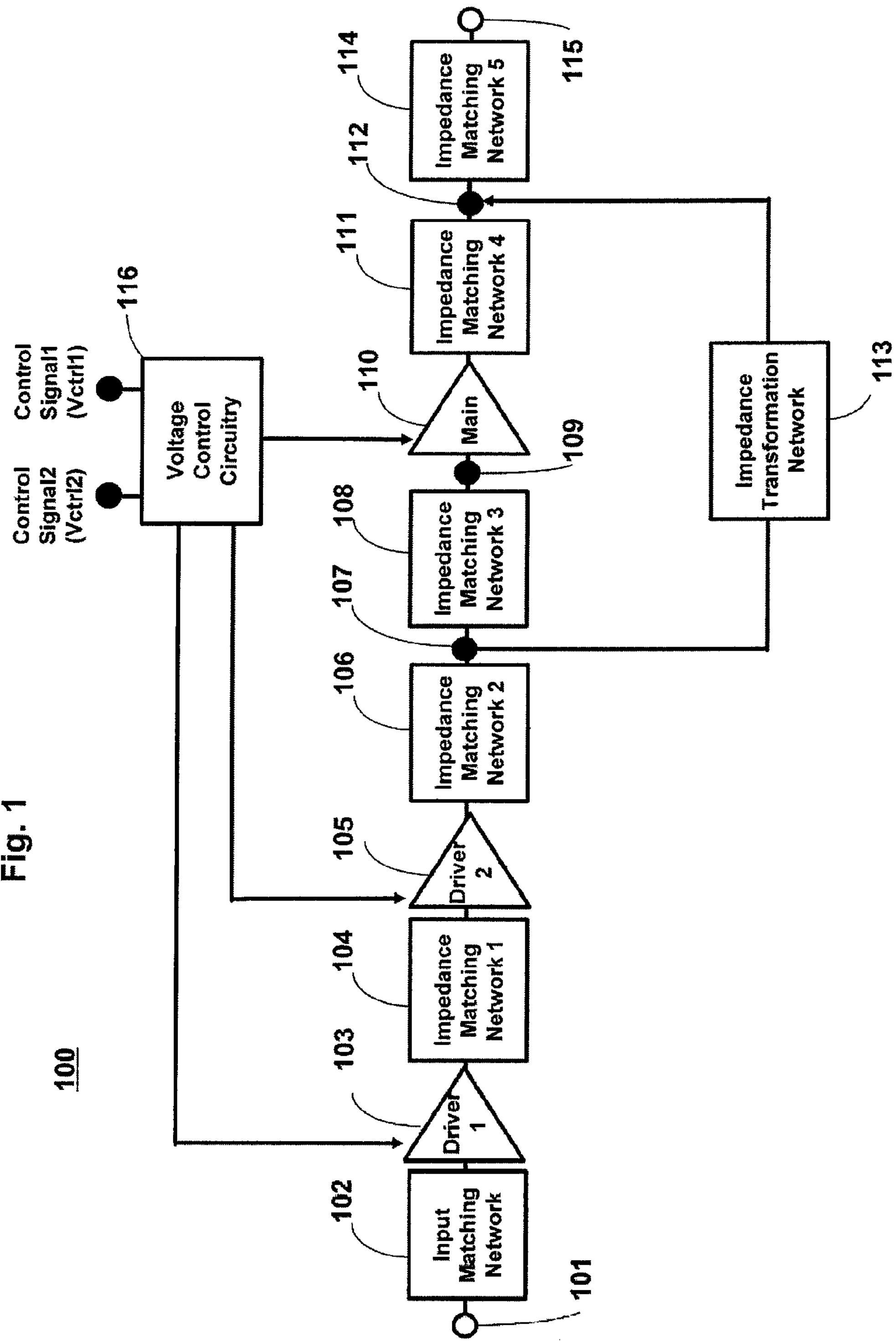
FIG. 1 is a simplified schematic diagram of a multiple output power mode amplifier (PMA) in accordance with a representative embodiment.

FIG. 1 is a simplified schematic diagram of a multiple power mode power amplifier (PA) 100 in accordance with a representative embodiment. The PA 100 includes an input impedance matching network 102 having the input 101; a first driver 103 adapted to amplify an input signal; and a first impedance matching network 104 connected to the first driver 103. The PA 100 also includes a second driver 105 and a second impedance matching network 106 connected to the second driver 105; a third impedance matching network 108; a power stage 110 between the third impedance matching network 108 and a fourth impedance matching network 111. An impedance transformation network 113 is provided between nodes 107 and 111. Prior to reaching an output 115, signals of all power modes traverse a fifth impedance matching network 114.

The PA 100 also includes voltage control circuitry (VCC) 116. Illustratively, the voltage control circuit adjusts the quiescent (Q) currents of the first and second drivers 103,105 via first and second control signals (Vctrl1 and Vctrl2); and turns on/off the main stage 110. Accordingly, and as described more fully herein, the VCC 116 selectively controls the function of the first and second drivers 103,105 and the power stage 110, thereby selectively engaging the low-power, mid-power and high-power signal paths and thus the modes of operation of the PA 100. The VCC 116 may be instantiated in hardware or firmware, and software.

Notably, certain details of the components and the function of the components of the PA 100 used in the low-power mode and the high-power mode describe presently may be found in U.S. Patent Publication 2005/0083117 A1 entitled "Multiple Power Mode Amplifier with Bias Modulation Option and without Bypass Switches" to Kim, et al. The disclosure of this commonly assigned publication (application) is specifically incorporated herein by reference.

The high-power signal path provides the mode of operation with the greatest gain.

In high-power mode, a signal at the input 101 traverses the input impedance matching network 102, is amplified at the first driver 103 and traverses the first impedance matching network 104 and the second driver 105. After amplification at the second driver 105, the signal traverses the second impedance matching network 106 and the third impedance matching network 108 before being amplified at the main stage 110.

In high-power mode operation the VCC 116 turns on (biases) the main stage 110 and adjusts the Q-currents of first and second drivers 103, 105 to a comparatively high current level. With the main stage 110 forward biased, at node 107, the impedance of the third impedance matching network 108 is lower than that of the impedance transformation network 113. Therefore, the output power from second driver stage 105 goes through the main stage 110 and high output power from main stage 110 can be achieved at the output 115.

The mid-power signal path provides the mode of operation with a middle level of gain for the input signal. In mid-power mode, a signal at the input 101 traverses the input impedance matching network 102, is amplified at the first driver 103 and traverses the first impedance matching network 104 and the second driver 105. After amplification at the second driver 105, the signal traverses the second impedance matching network 106.

At node 107, the signal traverses the impedance transformation network 113 and couples to the fifth impedance matching network 114 via node 112.

In mid-power mode, the VCC 116 turns off (reverse biases) the main stage 110 and adjusts the Q-current of first and second drivers 103, 105 to a mid-range operating current. Because the main stage 110 is off, the impedance of the impedance transformation network 113 is lower than that of the third impedance matching network 108. Therefore, at node 107 the output power from second driver 105 is diverted through the impedance transformation network 113 and is delivered to output 115.

The low-power signal path provides the mode of operation with a low level of gain for the input signal. In low-power mode, a signal at the input 101 traverses the input impedance matching network 102, is amplified at the first driver 103 and traverses the first impedance matching network 104 and the second driver 105. After amplification at the second driver 105, the signal traverses the second impedance matching network 106. At node 107, the signal traverses the impedance transformation network 113 and couples to the fifth impedance matching network 114 via node 112.

In low-power mode, the VCC 116 turns off the main stage 110 and adjusts the Q-current of the first and second drivers 103, 105 to a low-side operating current. Because the main stage 110 is off, the impedance of the impedance transformation network 113 is lower than that of the third impedance matching network 108. Therefore, at node 107 the output power from second driver 105 is diverted through the impedance transformation network 113 and is delivered to output 115. In low power mode, very low idle current and low current consumption is can be realized.

As will be appreciated, the option of selecting the power mode beneficially allows current consumption to be reduced or increased as needed. As such, the battery of devices that incorporate the PA 100 can be smaller in size and capacity, while beneficially increasing the use-time of the device. Moreover, and as described herein, in addition to improving the efficiency of power amplification, the linearity is also maintained. Beneficially, improved efficiency and linear response in all modes of operation may be realized without use of DC-DC converters or RF switches.

Illustratively, the first driver, second driver and main stage Q-currents are approximately 5 mA, approximately 20 mA and approximately 60 mA, respectively. In middle power mode, the first driver, the second driver and the main stage Q-currents are approximately 4 mA, approximately 16 mA and approximately 0 mA, respectively. In low power mode, first driver, second driver and main stage Q-currents are approximately 3 mA, approximately 7 mA and approximately 0 mA, respectively. Since the Q-currents are significantly reduced in the low and mid-power mode, the efficiency can be increased.

Table 1 illustrates the function of each component of the PA 100 in various modes of operation.

TABLE I

| Mode of Operational Mode | Vctrl1 | Vctrl2 | 1st Driver stage | 2nd Driver stage | Main stage |
|---|---|---|---|---|---|
| High Power Mode | Low | Low | High current | High current | Turn-On |
| Middle Power Mode | High | Low | Middle current | Middle current | Turn-Off |
| Low Power Mode | High | High | Low current | Low current | Turn-Off |

As will be appreciated from a review of Table 1, the Q-current to the first, second and main stages 102,105, 110, respectively, governs the operation of the device in low, id and high power (current) mode. Moreover, as described herein, the efficiency and linearity of operation are maintained.

Figure 2:
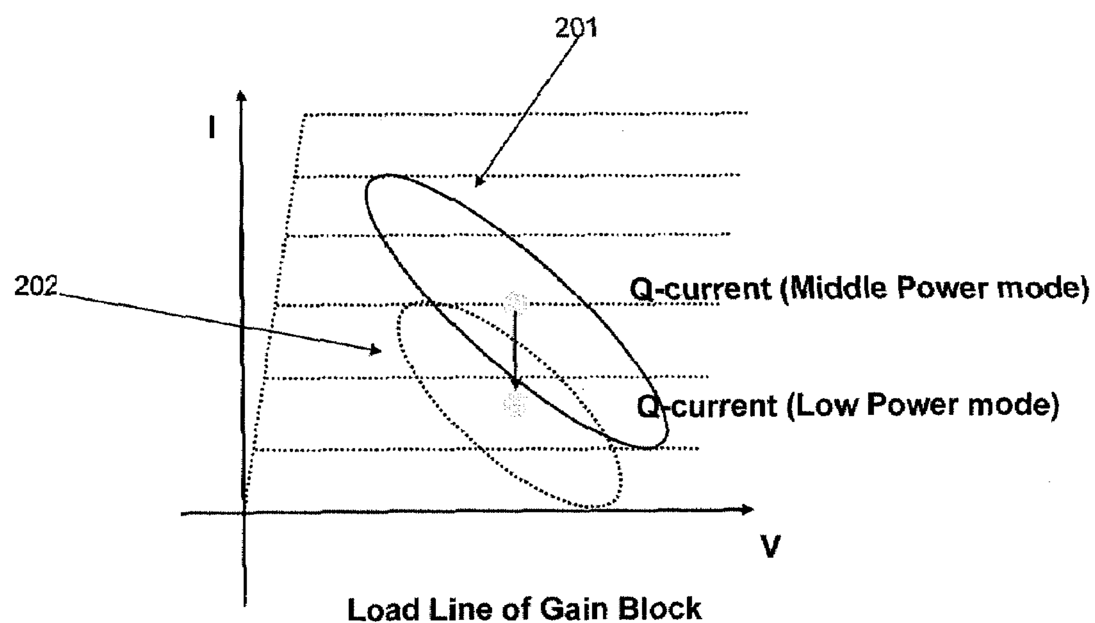
FIG. 2 is a graph of a current versus voltage characteristic (I-V Curve) of a PMA in accordance with a representative embodiment.

FIG. 2 is a graphical representation illustrating an active load line 201, 202 of the PA 100 at mid-power mode and low-power mode, respectively. During middle power mode and low power mode, the load line has some current (I) and voltage (V) margin with the lower the power level the greater the current (I) and voltage (V) margins. To enhance the efficiency this current (I) and voltage (V) margin should be reduced if not eliminated. According to representative embodiments, the margins are made comparatively small via the adjustments of the Q-currents in accordance with the present teachings. This is particularly advantageous compared to voltage margin reduction in known devices using a DCDC converter, which adds to the size, complexity and cost of the power amplifier.

Moreover, the PA 100 exhibits linearity in low and mid-power modes. To this end, as shown in FIG. 2, the rail-to-rail swing of the load lines 201,202 do not meet or 'touch' the I-axis or the V-axis, which indicates substantially linear operation. Moreover, the adjustability of the Q-current afforded by the VCC 116 allows a trade-off of linearity and Q-current. If Q-current is reduced, the swing might touch the V-axis and non-linear response and signal distortion may be realized. Therefore, we can reduce Q-current based on the swing (active load-line). Since in FIG. 2, the active load line 201 does not touch the axis, a margin for controlling the Q-current is provided. Moreover, in low-power mode, the active load line 202 also affords some margin for the Q-current adjustment, but as can be seen, the margin is not as great as afforded the mid-power mode Q-current.

Figure 3:
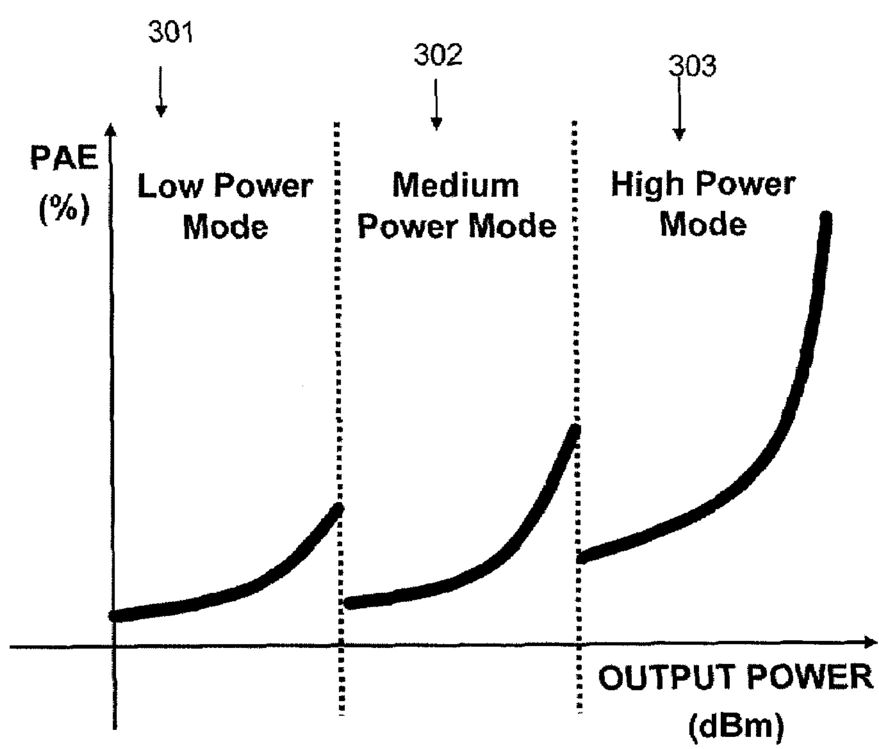
FIG. 3 is a graphical representation of relative power amplifier efficiency (PAE) versus output power mode in accordance with a representative embodiment.

FIG. 3 is a graphical representation of the output versus power amplifier efficiency (PAE) for the three modes of operation. The low-power mode shows a PAE 301 from initial turn-on of the PA 100 to the switching point (vertical line) to low-power mode. In mid-power mode, a PAE 302 from over the range of the low-power mode is shown, and a PAE 303 is shown for the range of the high-power mode. Notably, at each switching point, as expected, the efficiency drops as shown.

Figure 4:
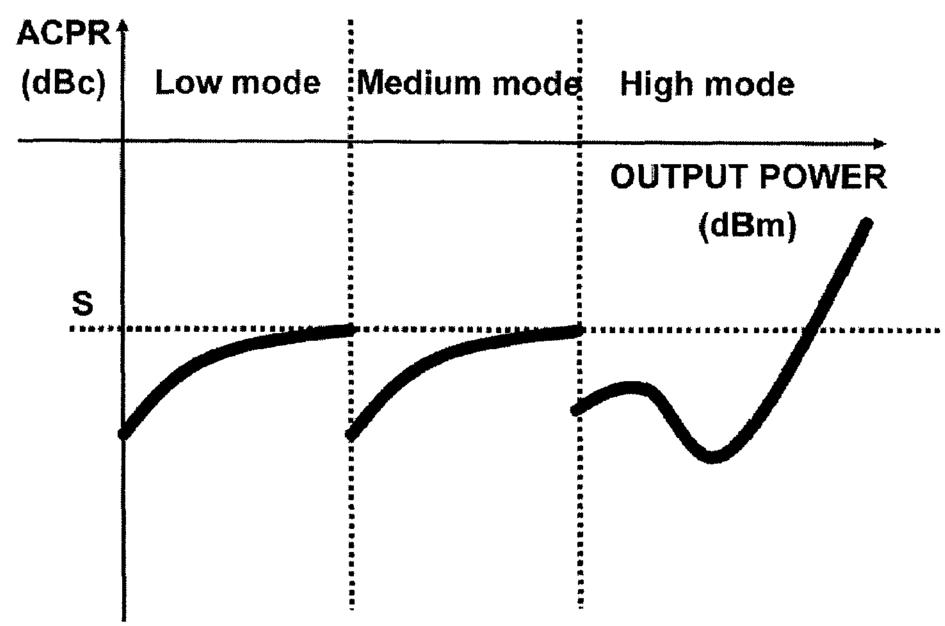
FIG. 4 is a graphical representation of adjacent power channel ratio (ACPR) in dBc versus output power mode in accordance with a representative embodiment.

FIG. 4 is a graphical representation of adjacent power channel ratio (ACPR) in dBc versus output power mode in accordance with a representative embodiment. Notably, the line 'S' represents a linear response. As will be appreciated from a review of the graph, the low-power and mid-power modes provide linear response over the majority of their operational ranges.

Figure 5:
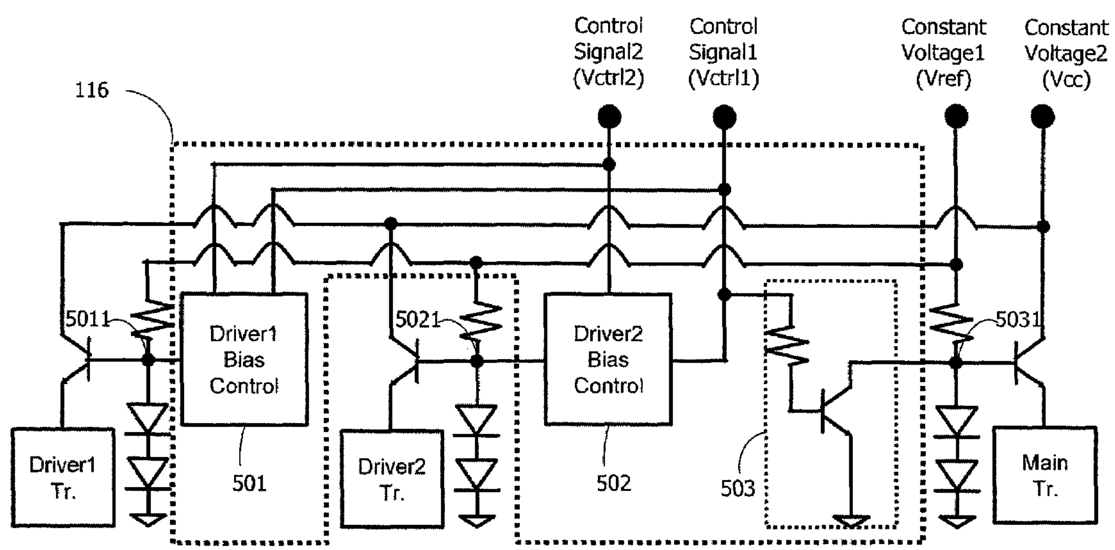
FIG. 5 is a simplified schematic diagram of a voltage control circuit in accordance with a representative embodiment.

FIG. 5 is a simplified schematic diagram of VCC 116 in accordance with a representative embodiment. The VCC 116 is connected to bias circuits of Drivern transistor, Driver2 transistor, and Main transistor. And according to control signals, Vctrl1 and Vctrl2, the drivern bias control circuit 501, driver2 bias control circuit 502, and main bias control circuit 503 control the current flow of each bias circuit of Driver1 transistor, Driver2 transistor, and Main transistor. At high power mode (Vctrl1 'low' and Vctrl2 'low'), the VCC 116 makes the Q-currents of the Driver1 transistor, Driver2 transistor comparatively high current level and turns on the Main transistor. At middle power mode (Vctrl1 'high' and Vctrl2 'low'), the VCC 116 turns off the Main transistor because the main bias control circuit 503 converts the voltage at node 5031 to 0.0 V. In addition, the drivern bias control circuit 501 and driver2 bias control circuit 502 adjust the voltages at nodes 5011 and 5021 to lower bias condition, respectively. Thus, Q-currents of Driver1 transistor and Driver2 transistor are reduced to middle operation current level. At low power mode (Vctrl1 is high and Vctrl2 is high), the Main transistor remains off-state, and the driver1 bias control circuit 501 and driver2 bias control circuit 502 adjust the voltages at nodes 5011 and 5021 to lowest bias condition, respectively. Thus, Q-currents of Driver1 transistor and Driver2 transistor are adjusted to low operation current level.

Figure 6A:
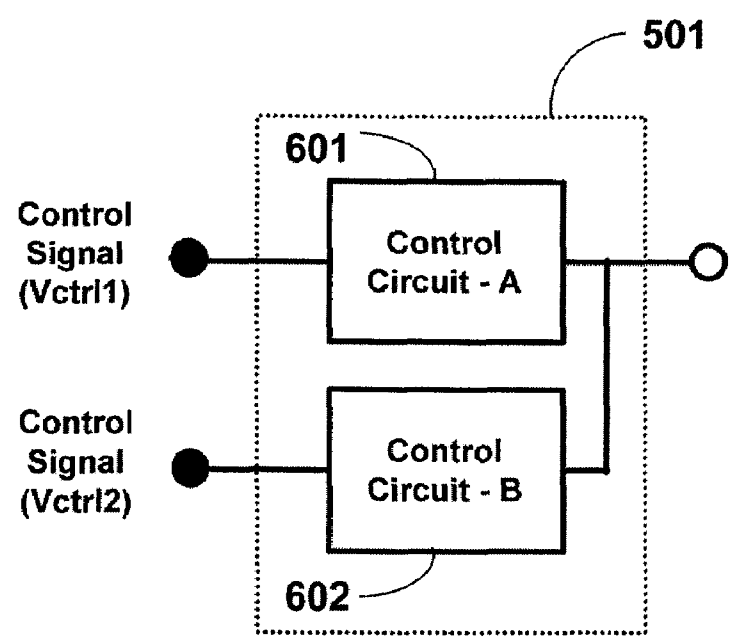
FIGS. 6A and 6B are simplified schematic diagrams of a driver bias control circuit in accordance with representative embodiment.

FIG. 6A is a simplified schematic diagram of bias control circuits 501 in accordance with a representative embodiment. The control circuits 501 consists of a first control circuit 601 and a second control circuit 602. The first control circuit 601 and the second control circuit 602 respond to the first control signal Vctrl1 and the second control signal Vctrl2, respectively. The two control circuits 601, 602 can have same circuit or different topologies. The first control circuit 601 controlled by control signal Vctrl1 reduces Q-current of Driver1 transistor to middle power state. When the control signal Vctrl1 is high, the first control circuit 601 provides decreasing current to the output to reduce the Q-current of Driver1 transistor. The second control circuit 602, which is controlled by control signal Vctrl2, reduces Q-current of Driver1 transistor to low power state. When the control signal Vctrl2 is high, the second control circuit 602 provides even further decreasing current to reduce the Q-current of Drivern transistor.

Figure 6B:
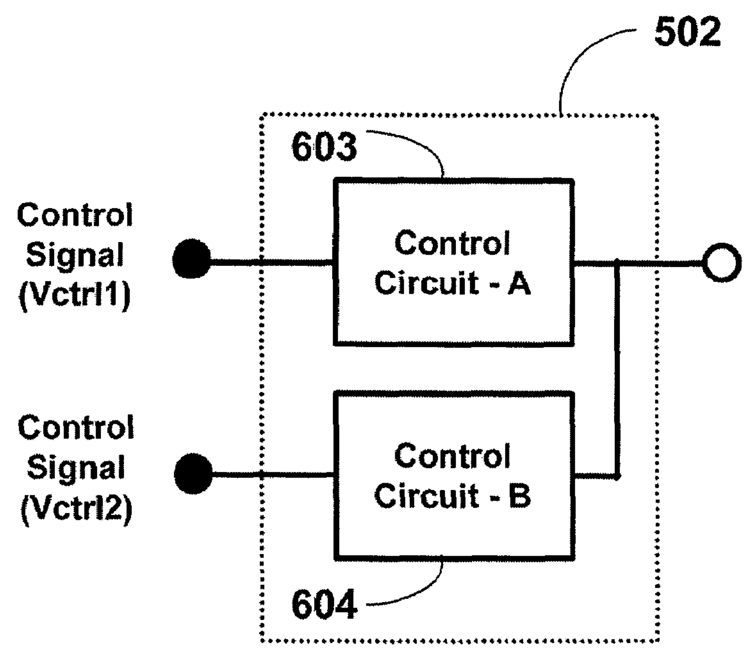

FIG. 6B is a simplified schematic diagram of bias control circuits 502 in accordance with a representative embodiment. The control circuit 502 consists of a first control circuit 603 and a second control circuit 604. The two control circuits can be same circuit topology and different with each other. The first control circuit 603 controlled by control signal Vctrl1 reduces Q-current of Driver2 transistor to middle power state. When the control signal Vctrl1 is high, the first control circuit 603 provides decreasing current to the output to reduce the Q-current of Driver2 transistor. The second control circuit 604 controlled by control signal Vctrl2 reduces Q-current of Driver2 transistor to low power state. When the control signal Vctrl2 is high, the second control circuit 604 provides further decreasing current to reduce the Q-current of Driver2 transistor.

Figure 7A:
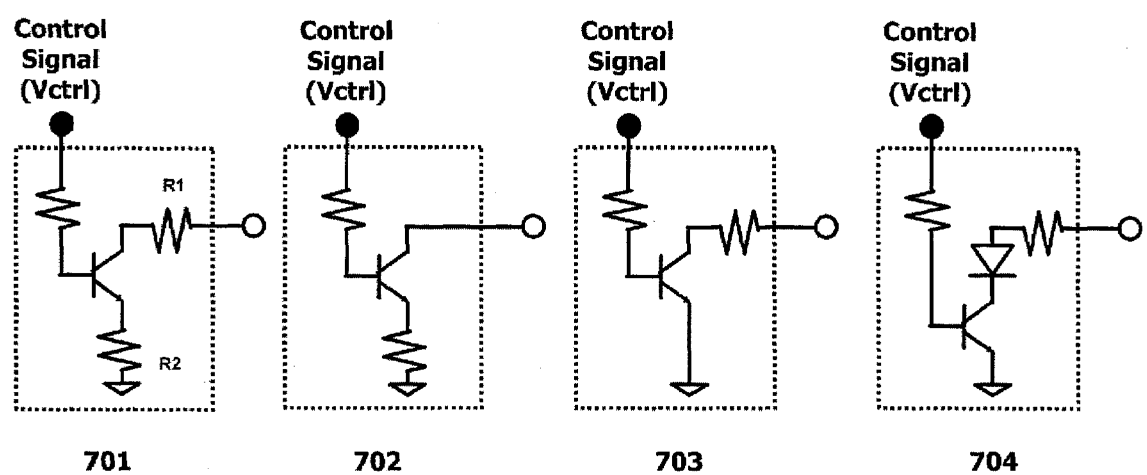
FIGS. 7A-7C are simplified schematic diagrams of control circuits in accordance with a representative embodiment.
Figure 7B:
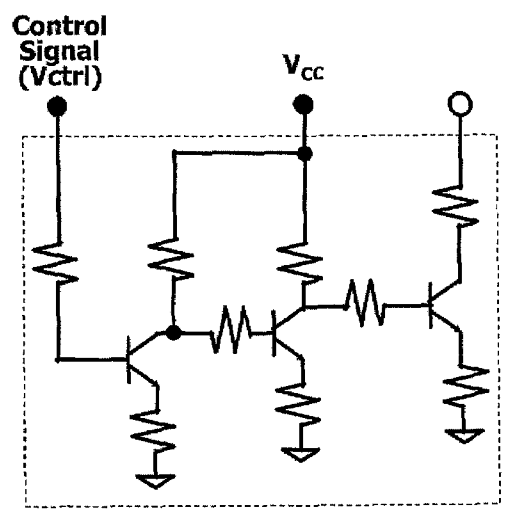
Figure 7B:
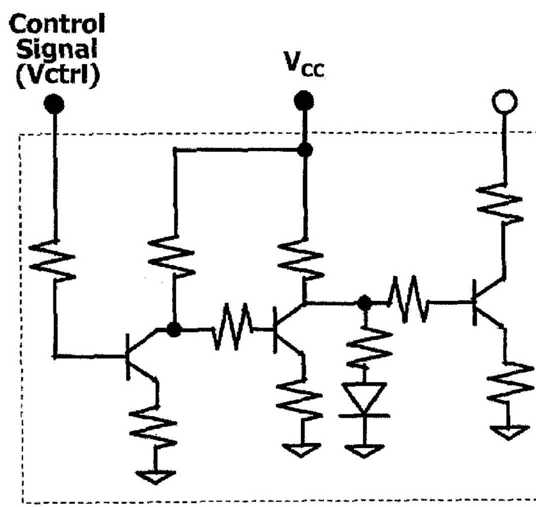
Figure 7C:
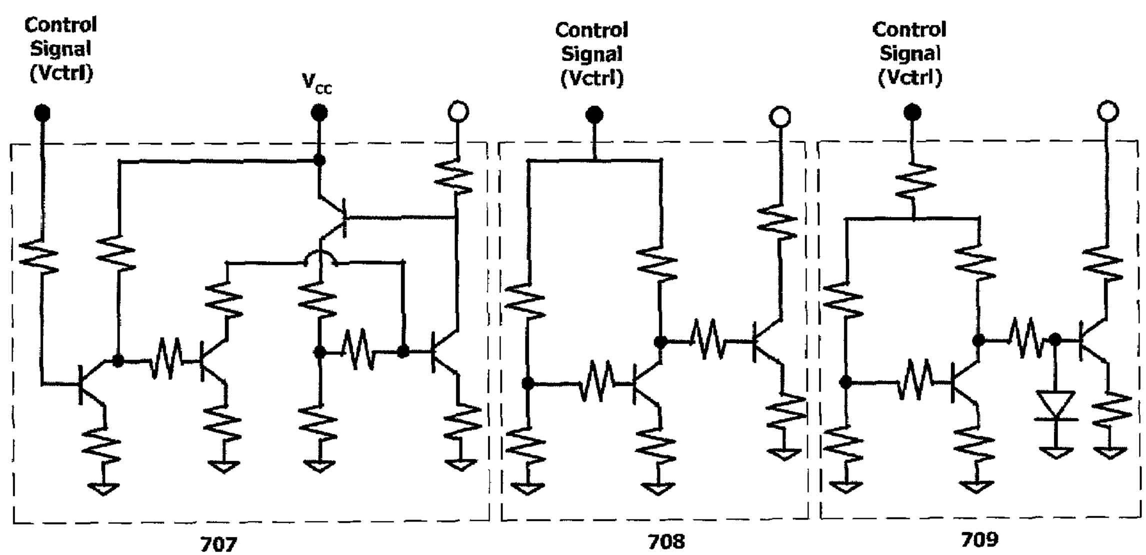

FIGS. 7A-7C are simplified schematic diagrams of control circuits in accordance with a representative embodiment. The control circuits 701-709 are illustrative circuits adapted for use as driver bias controls 501, 502 and control circuits 601, 602. These circuits are merely representative control circuits and other control circuits may be implemented to realize the VCC 116.

Figure 8A:
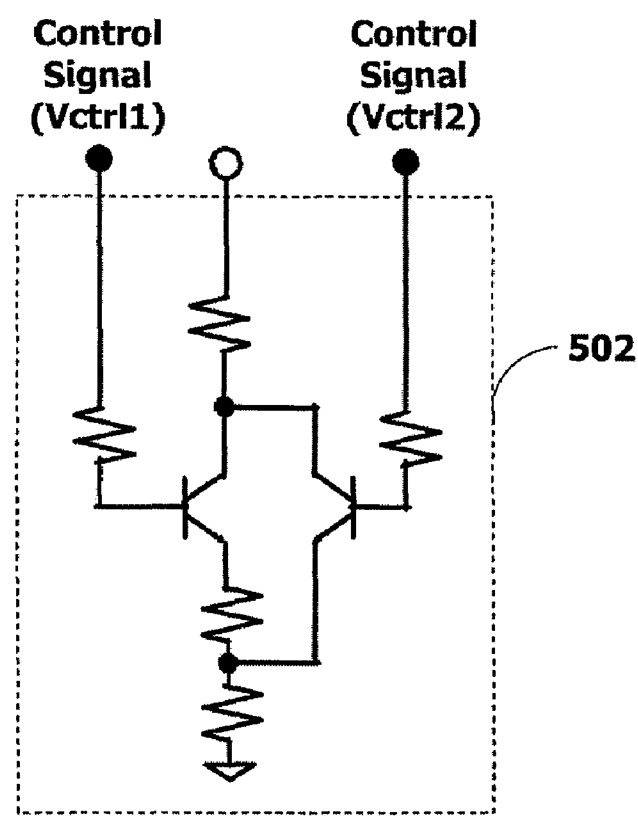
FIGS. 8A and 8B are simplified schematic diagrams of control circuits in accordance with a representative embodiment.
Figure 8B:
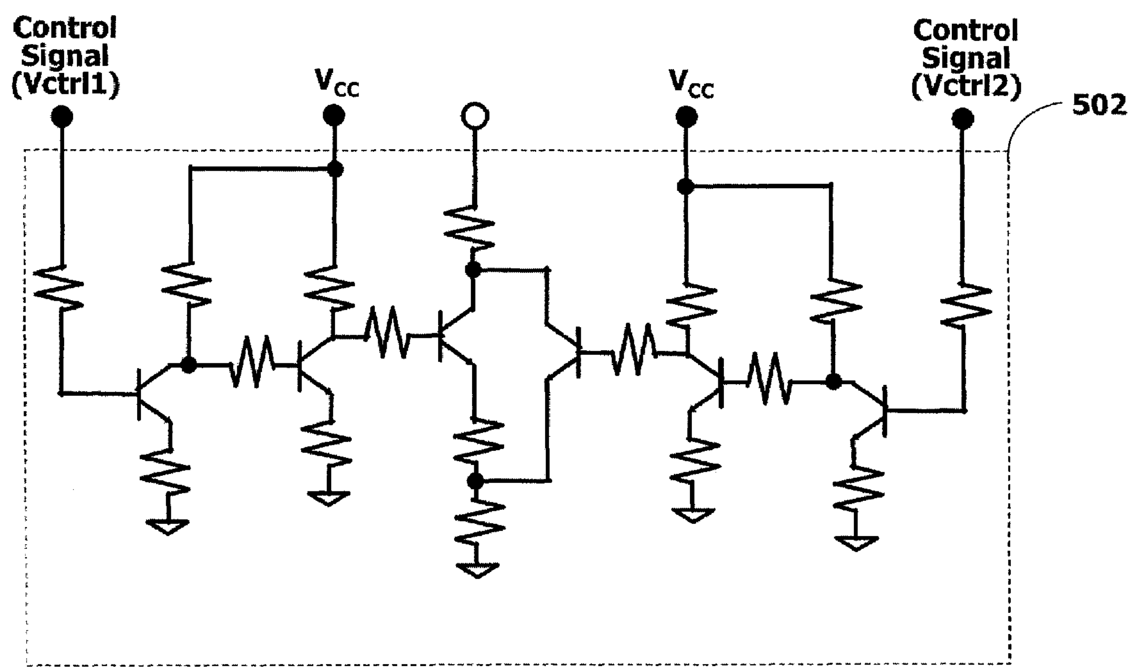

FIGS. 8A-8B are simplified schematic diagrams of control circuits in accordance with a representative embodiment. The control circuits shown are illustrative circuits adapted for use as second driver bias control 502. These circuits are merely representative control circuits and other control circuits may be implemented to realize the VCC 116.

Figure 9:
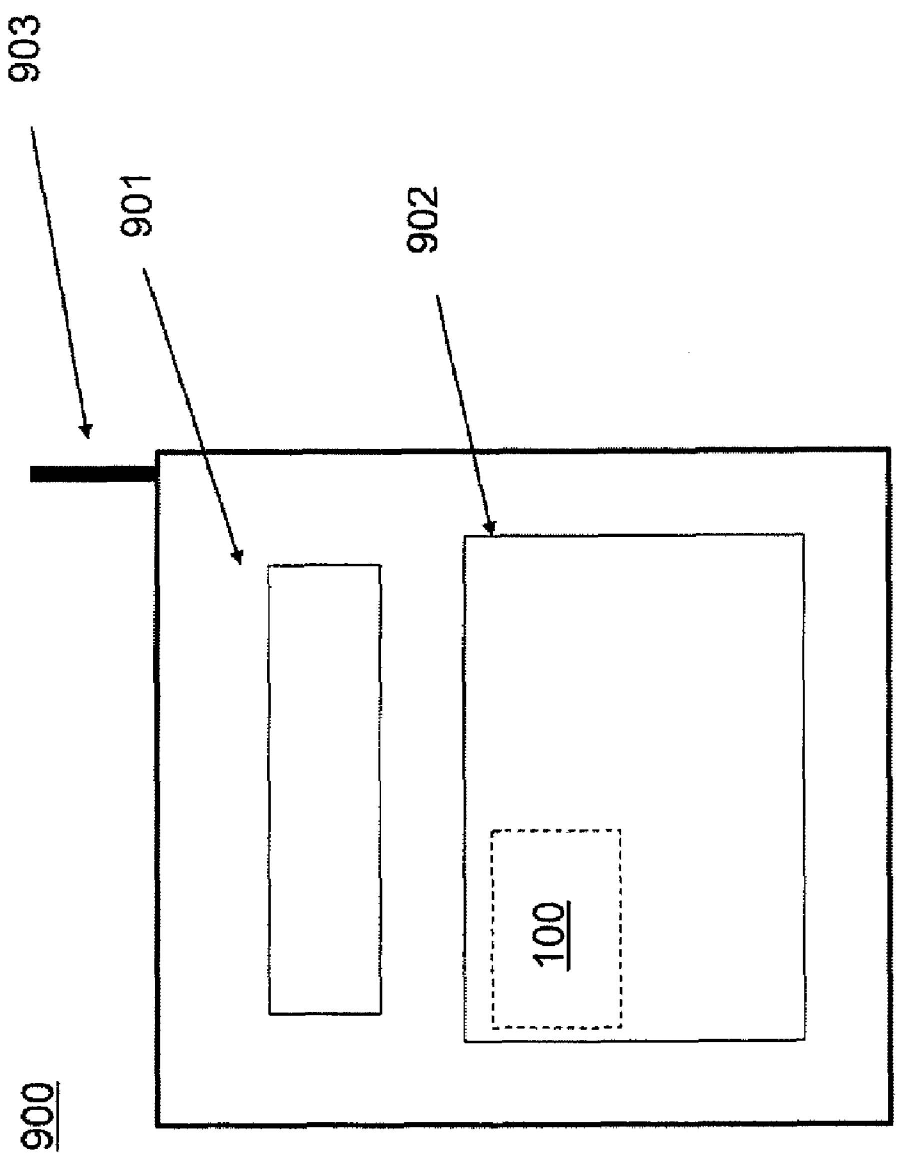
FIG. 9 is a simplified block diagram of an electronic device in accordance with a representative embodiment.

FIG. 9 is a conceptual view of an electronic device 900 in accordance with a representative embodiment. The device 900 illustratively includes a display 901, an interface 902 and an antenna 903. Moreover, the device 400 includes the power PA 100 described previously. In representative embodiments, the device 900 may be a mobile (cellular) telephone, a personal digital assistant (PDA), a portable computer, a portable video player, a portable camera, a portable music player, a portable gaming device or a combination of one or more of these devices. It is emphasized that the noted devices are merely illustrative and that other devices having a need for improvements afforded by the present teachings are contemplated.

In connection with illustrative embodiments, multimode power amplifiers and electronic devices including multimode power amplifiers are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A multiple power mode amplifier, comprising:

(a) an input impedance matching network having an input configured to receive an input signal;

(b) a first driver operably coupled to the input impedance matching network and configured to amplify the input signal and provide a first driver output signal therefrom;

(c) a first impedance matching network operably connected to the first driver and configured to receive the first driver output signal and provide a first impedance matching network output signal therefrom;

(d) a second driver operably coupled to the second impedance matching network and configured to amplify the first impedance matching network output signal and provide a second driver output signal therefrom;

(e) a second impedance matching network operably connected to the second driver and configured to receive the second driver output signal and provide a second impedance matching network output signal therefrom;

(f) a third impedance matching network operably connected to the second impedance matching network and configured to receive the second impedance matching network output signal and provide a third impedance matching network output signal therefrom;

(g) a power stage operably coupled to the third impedance matching network and configured to amplify the third impedance matching network output signal and provide a power stage output signal therefrom;

(h) a fourth impedance matching network operably connected to the power stage and configured to receive the power stage output signal and provide a fourth impedance matching network output signal therefrom;

(i) a fifth impedance matching network operably connected to the fourth impedance matching network and configured to receive the fourth impedance matching network output signal and provide a fifth impedance matching network output signal therefrom;

(j) an impedance transformation network operably coupled between a first node located between the second and third impedance matching networks and a second node located between the fourth and fifth impedance matching networks; and (k) voltage control circuitry operably connected to the first driver, the second driver and the power stage, and configured to adjust quiescent (Q) currents corresponding to the first and second drivers, and to turn the power stage on and off;

wherein the power mode amplifier is further configured to operate in high-, mid- and low-power modes such that in a high-power mode the input signal traverses the input impedance matching network, the first driver, the first impedance matching network, the second driver, the second and third impedance matching networks, the power stage, and the fourth and fifth impedance matching networks while the power stage is turned on and Q-currents of the first and second drivers are set to a high level by the voltage control circuitry, in a mid-power mode the input signal traverses the input impedance matching network, the first driver, the first impedance matching network, the second driver, the second impedance matching network, the impedance transformation network, and the fifth impedance matching network while the power stage is turned off and Q-currents of the first and second drivers are set to a middle level by the voltage control circuitry, and in a low-power mode the input signal traverses the input impedance matching network, the first driver, the first impedance matching network, the second driver, the second impedance matching network, the impedance transformation network, and the fifth impedance matching network while the power stage is turned off and Q-currents of the first and second drivers are set to a low level by the voltage control circuitry.

2. The multiple power mode amplifier of claim 1, wherein the amplifier includes no DC-DC converters or RF switches.

3. The multiple power mode amplifier of claim 1, wherein in the high-power mode the first driver, the second driver and the power stage Q-currents are about 5 mA, about 20 mA and about 60 mA, respectively.

4. The multiple power mode amplifier of claim 1, wherein in the mid-power mode the first driver, the second driver and the power stage Q-currents are about 4 mA, about 16 mA and about 0 mA, respectively.

5. The multiple power mode amplifier of claim 1, wherein in the low-power mode the first driver, the second driver and the power stage Q-currents are about 3 mA, about 7 mA and about 0 mA, respectively.

6. The multiple power mode amplifier of claim 1, wherein the fifth impedance matching network output signal provided by the amplifier is substantially linear.

7. The multiple power mode amplifier of claim 1, wherein the voltage control circuitry comprises a Control Signal1 (Vctrl1) input and a Control Signal2 (Vctrl2) input.

8. The multiple power mode amplifier of claim 1, wherein the amplifier is incorporated into one or a combination of one or more of: a mobile telephone; a personal digital assistant; a portable computer; a portable camera; a portable video player; a portable music player; and a portable gaming device.

9. The multiple power mode amplifier of claim 1, wherein the amplifier is a power amplifier module (PAM).

10. The multiple power mode amplifier of claim 1, wherein the amplifier is incorporated into a device comprising one or more of a display and an antenna.

* * * * *